United States Patent [19]

Keenan et al.

[11] Patent Number: 4,903,199
[45] Date of Patent: Feb. 20, 1990

[54] METHOD OF INCREASING THE SPEED OF TEST PROGRAM EXECUTION FOR TESTING ELECTRICAL CHARACTERISTICS OF INTEGRATED CIRCUITS

[75] Inventors: W. Russ Keenan; Stephen F. Comen, both of Dallas; Robert J. Brainard, Carrollton, all of Tex.

[73] Assignee: Texas Instruments Incorporated, Dallas, Tex.

[21] Appl. No.: 183,195

[22] Filed: Apr. 19, 1988

[51] Int. Cl.$^4$ ............................................. G06F 11/00
[52] U.S. Cl. .................................... 364/300; 371/22.1
[58] Field of Search .................. 364/200, 300, 900; 371/20

[56] References Cited
U.S. PATENT DOCUMENTS 4,339,819 7/1982 Jacobson ........................ 364/200 X Primary Examiner—Raulfe B. Zache
Attorney, Agent, or Firm—B. Peter Barndt; James T. Comfort; Melvin Sharp

[57] ABSTRACT

Disclosed is a method which speeds up interpretive test program code execution and allows rapid changes to the test code. The tester utilized with the present invention uses the interpretive language TPL (Test Program Language) for device test programs. The present invention uses the first execution of a statement in an interpreted environment to build a table of address value pairs corresponding to the values computed by the statement. It then changes the pseudo code of the statement to use a short assembly language routine to write the values in the table fo their appropriate addresses, using the memory mapped features of the test head hardware. This is done by translating each TPL line into pseudo code as it is loaded. The first time a line of code is executed, it builds a table which contains all the values computed and the addresses to which they are written. The next time the statement is executed, the verb pointer points to the turbo software which is executed rather than the TPL statement. Since the test head hardware is memory mapped, no distinction needs to be made between data being saved by the software and data being written to the test head. All error checking and calibration is done by the emulator code the first time the statement is executed and does not need to be repeated thereafter.

11 Claims, 1 Drawing Sheet

Figure 1

METHOD OF INCREASING THE SPEED OF TEST PROGRAM EXECUTION FOR TESTING ELECTRICAL CHARACTERISTICS OF INTEGRATED CIRCUITS

FIELD OF THE INVENTION

This invention relates to test systems for integrated circuits, and more particularly to a method for increasing the speed of interpretive code execution and for changing test codes.

DISCUSSION OF THE PRIOR ART

An application or high level language is a program written in a form which a user of a computing or test system is familiar, rather than a machine language, and includes a coded instruction stream which is convertible into a plurality of serially executable source statements, selected source statements including one or more operands in the form of symbolic addresses, and other selected source statements requiring conditional or unconditional branches to still another source statement identified by a label.

A compiler is a program which operates in a computing system, taking as its input the machine readable instruction stream of a program written in a high level language, to interpret the source statements and produce object code. The object code is suitable for link editing into a load module which is directly executable by the computing system, and generally includes more than one object (machine language) instruction for each source statement.

Commonly used high level languages include COBOL, FORTRAN, and BASIC. Each of these high level languages are written with a series of instructions that use English like statements, and in some instances mathematical notations. COBOL and FORTRAN programs are usually complied prior to program execution. BASIC can also be compiled, but in some computers BASIC is interpreted. The interpreter takes each BASIC statement or command and interprets or translates it to a machine language equivalent. The machine language equivalent is executed immediately. No machine language code is generated that can be used again as in a compiled program.

BRIEF DESCRIPTION OF THE INVENTION

The invention is useful in testers for testing integrated circuits and is a method of taking an interpreted language, a language similar to the BASIC language, that is used in device test programs, and after a single execution of a single test loop using a pseudo code representative of the the high level language in which the program is written, TPL (Test Program Language), the pseudo code is restructured to write a table and a short assembly language program that is executed for each successive loop of the test program.

The test system consists of several test heads, each controlled by a dedicated processor. Communicators between each test head and a controller is carried out through an I/O interface. The hardware for each test head is memory mapped into local address space of each test head processor board.

The method of the invention is herein referred to as Turbo Processing or, Turbo Code, or Turboed.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
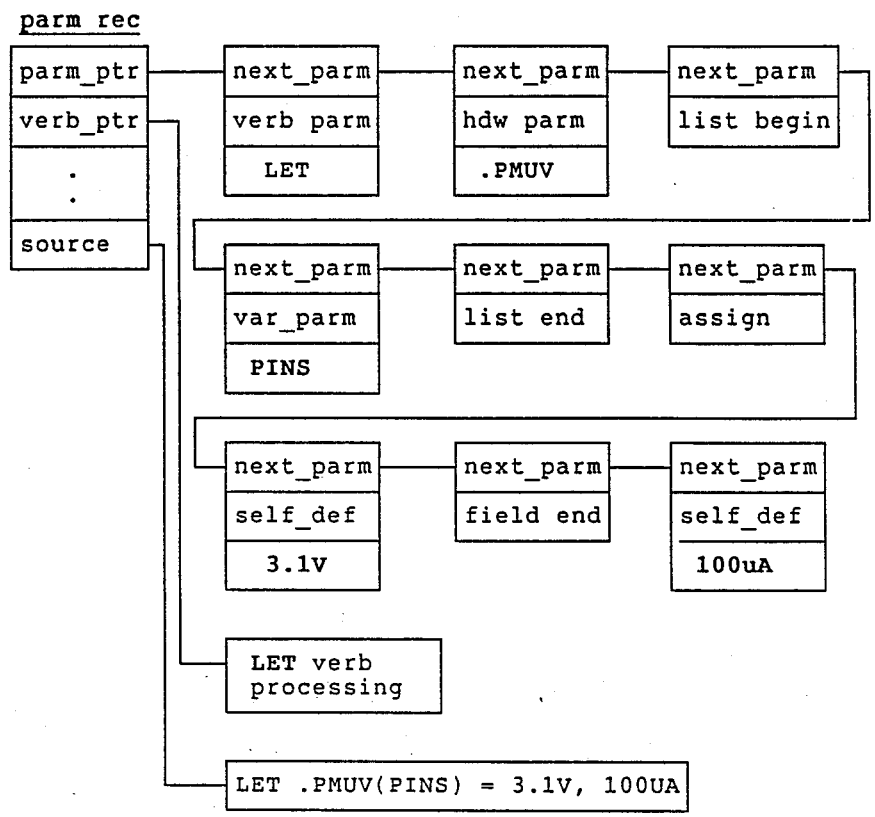
FIG. 1 is a diagram of a typical line of Test Program Language that has been translated into pseudo code.

The tester utilized with the present invention uses an interpreted language called TPL (Test Program Language) for device test programs. TPL is a BASIC- like language developed for use in testing integrated circuits. Turbo code enhances the performance of TPL, allowing certain statements to execute faster in an interpreted environment than is possible in a compiled environment.

Several factors combine to allow optimal speed in programming the test head hardware on the testers: (1) The test head hardware is memory mapped, so accesses to the test head hardware look just like local memory reads and writes; (2) The TPL device test programs execute a single test loop continuously to test a large number of devices; (3) TPL uses a pseudo code representative of each statement to control execution of the statement and is structured to allow the pseudo code to be altered at runtime to change the flow of execution; and (4) A large percentage of the TPL statements compute values which do not change from one execution of the statement to the next, or compute variables which depend only on the selection of an array element where all possible values of the array can be determined the first time the statement is executed. These include instructions such as:

LET.VCC1=500mV,250mA which programs the VCC1 board on the test head to supply 500 millivolts with a current of 250 milliamps;

LET.PMUV(IN:PINS)=1V,500mA where IN:PINS is an array of pin numbers. This statement will program all of the Parametric Measurement Units specified in the array IN:PINS to one volt with 500 milliamps of current;

LET.DRVL(IN:PINS(I))=250mV

This will program the 'low' driver reference level on the pin board specified in the Ith element of IN:PINS to 250 millivolts.

In the first two statements, the values that are computed and written to the hardware will not change between executions of the statement. In the third, all of the possible values for the statement can be determined by examining all of the values in IN:PINS the first time the statement is executed.

The following TPL statements are examples what can be turboed:

---

LET var = .ADC( ) or ADC( ): Read selected ADC value

-continued ex: LET reading = .ADC(.VCCI(.ICCI))
PRINT .UNIT(n), . . . where n evaluates to −1;
  ex: PRINT .UNIT(P), 'Passed IOH test'
TMU: set Time Measurement Unit and read the TMU
  ex: TMU .TIMRNG(3nS,.DLYENA(Q(I))),.STOP
  (OUT:PINS(I))
CONVERT: Activate PMU broadcast CONVERT ALL strobe
  ex: CONVERT .PMUV(OUT:PINS)
ENABLE: Enable selected board or circuit
  ex: ENABLE .VCCI, .PMU(OUT:PINS)
DISABLE: Disable selected board or circuit
  ex: DISABLE .VCCI, .PMU(OUT:PINS)

Constant value, or values that do not change during the test are defined with a LET statement:

| LET .hdware( ) | = constant values where ".hdware" is one of: |
|---|---|
| .CPEDG: | set compare edge delay generator on pin PWB |
| .STEDG: | set start edge delay generator on pin PWB |
| .SPEDG: | set stop edge delay generator on pin PWB |
| .DRVL: | set pin PWB 'low' programming driver reference level |
| .DRVH: | set pin PWB 'high' programming driver reference level |
| .DRVP: | set pin PWB PAL programming receiver reference level |
| .RCVL: | set pin PWB 'low' programming receiver reference level |
| .RCVH: | set pin PWB 'high' programming receiver reference level |
| .IOL: | set sourcing current for pin PWB |
| .IOH: | set sinking current for pin PWB |
| .VTH: | set programmable load threshold on pin PWB |
| .PINFMT: | set pin PWB format for drivers |
| .PMUV: | program voltage for Parametric Measurement Units |
| .PMUI: | program current for Parametric Measurement Units |
| .RLY: | set relays on pin PWB |
| .HOTRLY: | set relays on pin PWB when drivers, PMU or PLOAD are enabled |
| .TPER: | set system period generator period |
| .VCC1: | program voltage and current to VCC1 board |
| .VCC2: | program voltage and current to VCC2 board ex: LET .VCC1 = 1V, 500 mA LET .DRVL(IN:PINS) = 250 mV |

All values being assigned must be constants. For pin-card related functions, the pin cards must be specified by constants, an entire predefined array, or a predefined subscripted array. Also, if an array is used for the pin card specification, the values in the array may not change between executions of the turboed statement.

Turbo code takes advantage of all of the features of the hardware and software to provide very high speed programming of the test head hardware while still maintaining the flexibility of an interpreted language. Turbo code uses the first execution of a statement in an interpreted environment to build a table of address-value pairs corresponding to the values computed by the statement. It then changes the pseudo code of the statement to use a short assembly language routine to write the values in the table to their appropriate addresses, using the memory mapped feature of the test head hardware.

As each TPL line is loaded, it s translated into pseudo code. The emulator mainline uses this pseudo code while executing the statement. For example, the statement

LET.PMUV(PINS)=3.1V, 100UA is translated into the pseudo code illustrated in FIG. 1.

The Test Program Language translator generates a group of records for each line as it is translated (See FIG. 1). The main record is called the parm_rec. It contains a pointer to the pseudo code translation of the line (parm_ptr). Each pseudo code record contains a pointer to the next record (next_parm), the type of the pseudo code parameter (verb parm, hdw parm, etc), and the parameter itself. The parm_rec also contains a pointer to the actual source code for the statement and a pointer to the interpreter routine which is used for the specified verb (verb_ptr).

When this statement is executed, the emulator uses the verb pointer to begin processing with the LET verb routine. The LET verb routine checks the parm_ptr and determines that the first parameter is a hardware parm. It then calls pt_hardware processing, which determines that the hardware parm is .PMUV and calls PMUV processing. PMUV processing calls a routine which looks for the variable PINS in the symbol table. It then checks the data area to determine all of the values in the array PINS. These logical pin numbers are translated into physical pin numbers to determine the pin boards being programmed in the LET statement. PMUV processing then calls a routine which checks the parameter list, sees the self_defining constant 3.1V, and returns this value to be programmed as the PMU voltage.

Since the parameter list is not empty, the routine is called again and returns the 100μA to be programmed for the .PMU current. Each of these values is checked to make sure it is in the proper range and is then calibrated using gain and offset values stored in memory. This result is then translated into a 16 bit value which is written to the pin cards determined by the variable PINS. The values used to program the PMUs are also saved in memory for possible use later.

Figure 2:
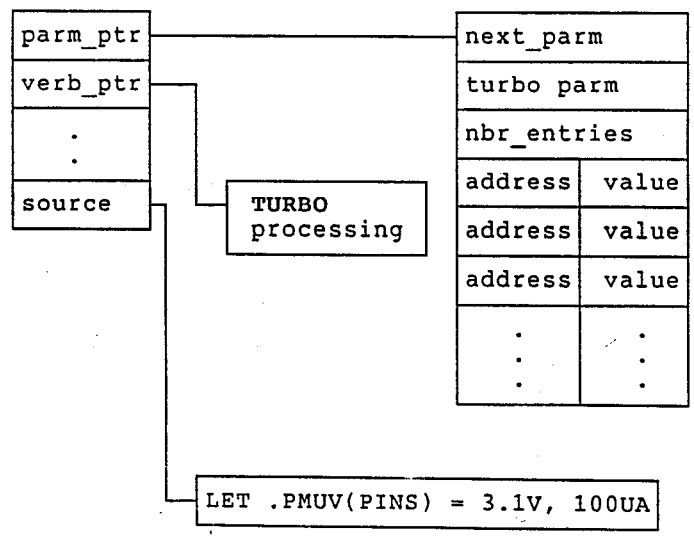
FIG. 2 is a diagram of the pseudo code of FIG. 1 that has been restructured according to the present invention.

When this code is turboed, the first execution of the statement follows the same steps as above. However, when the PMUV processing writes the values to the hardware, it also builds a table which contains all of the values computed and the addresses to which they are written. The pseudo code for the statement is then restructured as shown in FIG. 2.

The next time the statement is executed, the verb pointer points to the TURBO software, so this is executed instead of the LET verb processing. The TURBO software for this simplest case is a short assembly language loop:

|   | MOVE.L | (A5),A1 | Get address of turbo table |
|---|---|---|---|
|   | ADDQ.L | #6,A1 | Point A1 to the number of entries |
|   | MOVE.W | (A1),D1 | Load number of entries |
|   | SUBI.W | #1,D1 | Subtract 1 for use as a loop counter |
|   | ADDQ.L | #2,(A1) | Point A1 at beginning of array |
| LOOP: | MOVE.L | (A1)+,A0 | Get address of write |
|   | MOVE.W | (A1)+,(A0) | Write value |
|   | DBF | D1,LOOP | Branch until done |

The first five lines of this routine constitute a fixed overhead each time a turboed statement is executed, and the three line loop is executed once for each value that needs to be written by the routine. Because the test head hardware is memory mapped, no distinction needs to be made between data being saved by the software and data being written to the test head. Also, all error checking and calibration is done by the emulator code the first time the statement is executed and does not need to be repeated. Therefore, only three instructions are executed per value written, plus a small fixed overhead. In most cases, this code will execute faster than would code generated by a compiler since the compiled code needs to do most checking and calibration each time the statement is executed.

A slight variation of this is used for statements using subscripted arrays, such as LET.PMUV(PINS)(I)=3.1V, 100uA In this case, the first time the statement is executed, all of the possible values of I can be determined since the array must have been declared with a specified dimension and assigned values prior to use. Therefore, PMUV processing can determine the values that need to be written for all possible values of I and build a turbo table which contains all of these values as well as the address of the variable I. The turbo execution routine will then load the value of I and use it as an offset into the turbo table to load the proper values.

This method of building tables of address-value pairs is useful in a large number of typical Test Program Language statements, but there are other types of statements which require a different strategy to be turboed. In these cases, the first execution of the statement is used to do most of the applicable error checking and to build a table to be used in subsequent executions of the statements, but the table that is built has a different format depending upon the statement being executed. These statements include:

IF min .LT function .LT max where min and max are constants or variables, the comparison is one of .LT, .LE, .NE, .GT, .or .GE, and the function is any function defined in TPL, such as .ADC or .ADCR; and PRINT .UNIT(n), expression where n evaluates to $-1$.

For the IF statement, the table generated contains (1) the address of the first variable (min); (2) the address of the second variable (max); (3) the type of comparison (LT); (4) a pointer to the function parameter; and (5) the address of the line to be executed if the statement is false. The verb pointer is changed to point to a turbo-if routine. Normally, the IF statement must search forward through the test program to find the corresponding ELSE or ENDIF statement when the expression in the IF statement evalutes to false. The turbo-if routine calls the normal interpreter routine to determine the function value, and gets the min and max values from the addresses specified in the table and makes the appropriate comparison. If the comparison is true, execution continues with the next statement. If it is false, the execution is continued at the address stored in the table. This eliminates the overhead of checking the statement syntax, determining the min and max values, and searching ahead for the address to jump to if the expression is false.

The print statement is turboed to take care of the special case where the unit number is $-1$. Output from the PRINT routine can be sent to the terminal, line printer, or several other output ports. This is controlled by the unit number. When the unit number is $-1$, output is suppressed. This is used mainly in production test programs so that printing of some information can be dynamically controlled.

When a PRINT statement is executed and the unit number is $-1$, a turbo table is built which contains the address of the variable used in the unit number (n). The verb pointer is then changed to point to a print-turbo routine. This routine checks the value of n. If it is still $-1$, the rest of the PRINT statement is ignored and execution continues with the next statement. If the value of n has changed, the normal PRINT verb processing is called.

Implementing Turbo code on the tester showed statements executed four to twenty times faster after being turboed. Overall, 54% of the instructions executed when testing a good device using a SN74AS00 device test program can be turboed thus increasing the speed of test program execution. The device test time for this program is 234 milliseconds with turbo disabled and 63 milliseconds with turbo enabled.

What is claimed:

1. A method of increasing the speed of test program execution performed by a computer, the computer being part of a test system having a processor controlled test head and in which the test program executes a single test loop continuously to test a large number of semiconductor devices the test program having one or more program statements, and, the computer performing a first execution of at least some of the program statements of the test program, including the steps of:
   changing each program statement into a pseudo code;
   using the first execution of each program statement of the test program in an interpreted environment to build a table of values and addresses for the values computed or used by the statement; and
   changing the pseudo code of each statement to execute a new routine which uses the computed values.

2. The method according to claim 1, wherein the table created on the first execution of the program statement contains a set of address-value pairs corresponding to the values computed by the statement, and the routine used on subsequent executions writes each value of said table to its appropriate address.

3. The method according to claim 1, wherein the step of using the first execution of each program statement further comprises the step of:
   placing the addresses of the values computed by the routine into the table of values.

4. The method according to claim 2, wherein the table of values contains a set of address-value pairs corresponding to all possible values of an array, each address-value pair having a subscript dependent upon its position in the array, and the set of address-value pair selected depending upon its array subscript.

5. A method of increasing the speed of test program execution performed by a computer, the computer being part of a test system having a processor controlled test head and in which the test program executes a single test loop continuously to test a large number of semiconductor devices, the test program having one or more program statements, and, the computer performing a first execution of at least some of the program statements of the test program, including the steps of:
   changing each program statement into a pseudo code;

using the first execution of each program statement of the test program in an interpreted environment to build a table of address-value pairs corresponding to values computed by the statement; and changing the pseudo code of each statement to use a short assembly language routine to write each value in said table to its appropriate address.

6. The method according to claim 5, wherein said test system has a memory map feature, and said test head hardware is memory mapped by the memory map feature and the memory map feature is used to write each value in said table to its appropriate address.

7. The method of claim 5, wherein the test program has a flow of execution, and, wherein the pseudo code structure of each program statement is structured to allow the pseudo code to be altered at runtime to change the flow of execution.

8. The method according to claim 5, wherein a plurality of the program statements compute values which do not change from one execution of the statement to the next and compute variables which depend only on the selection of an array element where all possible values of the array can be determined during first execution of the statement.

9. The method according to claim 5, executing the program loop once for each value that needs to be written by the routine.

10. The method of claim 5, including the step of error checking and calibration at first execution of a code statement.

11. The method according to claim 5, wherein only three instructions are executed per value computed plus a fixed number of overheated statements.

* * * * *